(12) United States Patent
Powell

(10) Patent No.: US 11,661,184 B2
(45) Date of Patent: May 30, 2023

(54) SURFACE STIFFNESS OPTIMIZATION TO IMPROVE MORPHING SURFACE ACCURACY

(71) Applicant: The Government of the United States of America, as represented by the Secretary of the Navy, Arlington, VA (US)

(72) Inventor: Brandon Powell, Washington, DC (US)

(73) Assignee: The Government of the United States of America, as represented by the Secretary of the Naw, Washington, DC (US)

( * ) Notice: Subject to any disclaimer, the term of this patent is extended or adjusted under 35 U.S.C. 154(b) by 329 days.

(21) Appl. No.: 16/785,412

(22) Filed: Feb. 7, 2020

(65) Prior Publication Data
US 2020/0255138 A1    Aug. 13, 2020

Related U.S. Application Data

(60) Provisional application No. 62/802,402, filed on Feb. 7, 2019.

(51) Int. Cl.
*B64C 30/00* (2006.01)
*B64F 5/00* (2017.01)
*G06F 30/15* (2020.01)
*G06F 30/23* (2020.01)

(52) U.S. Cl.
CPC ............... *B64C 30/00* (2013.01); *B64F 5/00* (2013.01); *G06F 30/15* (2020.01); *G06F 30/23* (2020.01)

(58) Field of Classification Search
CPC ...... B64C 2003/445; B64C 3/48; B64C 30/00
See application file for complete search history.

(56) References Cited

U.S. PATENT DOCUMENTS

| | | | | |
|---|---|---|---|---|
| 5,662,294 A | * | 9/1997 | Maclean | B63B 1/28 114/140 |
| 6,634,594 B1 | * | 10/2003 | Bowcutt | B64C 3/10 244/36 |
| 7,516,918 B2 | * | 4/2009 | Cox | F02C 7/042 244/38 |
| 7,550,189 B1 | * | 6/2009 | McKnight | B64C 3/26 148/563 |
| 7,598,652 B2 | * | 10/2009 | Kornbluh | B64C 3/48 310/309 |
| 7,802,759 B2 | * | 9/2010 | Ishikawa | B64C 3/48 244/123.12 |
| 7,866,599 B2 | * | 1/2011 | Elvin | B64C 30/00 244/53 B |

(Continued)

*Primary Examiner* — Joshua J Michener
*Assistant Examiner* — Michael B. Kreiner
(74) *Attorney, Agent, or Firm* — US Naval Research Laboratory; Nigel R. Fontenot

(57) ABSTRACT

A method of designing a morphable aerodynamic surface includes discretizing and parameterizing a model of a morphable surface to create a function to optimize; utilizing finite element analysis to solve for displacements and associated errors at an initialization point; and iteratively calculating a gradient cost function, define step size and search direction, step according to defined step size and search direction, and recalculate displacements and associated errors to converge on final thickness vector.

6 Claims, 6 Drawing Sheets

(56) References Cited

U.S. PATENT DOCUMENTS

| | | | | |
|---|---|---|---|---|
| 7,901,524 B1* | 3/2011 | McKnight | ............... | B29C 61/00 |
| | | | | 148/563 |
| 8,256,706 B1* | 9/2012 | Smith | ................... | B64D 33/02 |
| | | | | 137/15.1 |
| 8,366,057 B2* | 2/2013 | Vos | ........................... | B64C 3/50 |
| | | | | 244/214 |
| 9,745,048 B2* | 8/2017 | Wood | ........................ | B64C 3/48 |
| 11,325,700 B2* | 5/2022 | Maxwell | ............... | B64C 1/0009 |

* cited by examiner

SURFACE STIFFNESS OPTIMIZATION TO IMPROVE MORPHING SURFACE ACCURACY

RELATED APPLICATIONS

This application claims the benefit of U.S. Provisional Application No. 62/802,402 filed Feb. 7, 2019, which is hereby incorporated herein by reference.

FEDERALLY-SPONSORED RESEARCH AND DEVELOPMENT

The United States Government as ownership rights in this invention. Licensing inquiries may be directed to Office of Technology Transfer, US Naval Research Laboratory, Code 1004, Washington, DC 20375, USA; +1.202.767.7230; techtran@nrl.navy.mil, referencing NC 108976.

FIELD OF THE INVENTION

The present invention relates generally to shapeable surfaces, and more particularly to shapeable surfaces having varying stiffnesses.

BACKGROUND

Morphable waveriders provide efficient operation across a wide range of Mach numbers by changing their bottom surface geometry to maintain shock attachment, and as a result, maintain the high aerodynamic performance associated with waveriders. Previous research has resulted in a method to morph a constant thickness 2D cross section of a morphing waverider to vary vehicle performance along with mach regime.

SUMMARY OF INVENTION

Recent developments in the field of morphing technology has significantly advanced systems for bi-stable morphing, space-based systems, aerodynamic applications such as airfoils as well as aerospace structures. Two assumptions are made in this prior work: the "skin" of the vehicle is relatively thin and flexible, and the surface is a constant thickness throughout its entirety. This inherently limits the capability of the vehicle's morphing accuracy, as a large number of actuation points are required to reduce error, particularly if either the loading or control point locations are asymmetrically defined. While previous efforts have used an increasing number of control points to improve the morphing accuracy, this study will allow the surface thickness to act as a free variable to improving morphing accuracy and/or reduce the number of control points. A balance between control system complexity, manufacturing complexity, and morphing error must be understood to design the proposed morphing aerospace structures most effectively. Both 2-D and 3-D surfaces can take advantage of this variable thickness to improve morphing performance, with 3-D surfaces likely seeing a larger improvement. Described herein is an exemplary methodology to design a morphing waverider with an anisotropic morphing surface to improve the performance relative to a baseline constant-thickness surface.

According to one aspect of the invention, a hypersonic waverider includes a leading edge; a base defining ends of the leading edge; an upper surface extending from the leading edge to the base; a lower surface extending from the leading edge to the base, wherein the lower surface is controllably morphable and includes a stiffness that varies across the extent of the surface; and one or more actuators attached to the lower surface and configured to actuate the lower surface from a first disposition to a second disposition. The upper and lower surfaces and base enclose an internal volume of the hypersonic vehicle. The lower surface is configured to have a first disposition relative to the upper surface defining a first waverider shape and a second disposition relative to the upper surface different from the first disposition defining a second waverider shape, thereby providing respective first and second flow characteristics during flight. The stiffness of the lower surface is configured to lower position error of the surface when actuated by the one or more actuators.

Optionally, the lower surface stiffness is varied by ribs.

Optionally, the lower surface stiffness is varied by modifying the thickness of a honeycomb structure.

Optionally, the lower surface stiffness is varied by locally changing the modulus of the surface material.

Optionally, the lower surface stiffness is varied by bimetallic or composite laminates.

Optionally, the lower surface stiffness is varied by varying the thickness of the surface.

According to another aspect of the invention, a method for designing a morphable aerodynamic surface includes the steps of discretizing and parameterizing a model of a morphable surface to create a function to optimize; utilizing finite element analysis to solve for displacements and associated errors at an initialization point; and iteratively calculating a gradient cost function, define step size and search direction, step according to defined step size and search direction, and recalculate displacements and associated errors to converge on final thickness vector.

The foregoing and other features of the invention are hereinafter described in greater detail with reference to the accompanying drawings.

DETAILED DESCRIPTION

Conventional aerodynamic control mechanisms have generally been considered to be rigid with fixed hinges: for example, an aileron on an airplane wing undergoes a rigid hinged deflection to induce roll. Recently, flexible morphing structures have been investigated as an alternative to this method due to the additional degrees of freedom that enable performance improvements over conventional systems. In the hypersonic regime in particular, a blended body and control system without sharp curvature deviations is desirable, as decoupled systems and sharp corners tend to increase pressure drag and heating. This effort is focused on using a flexible lower waverider surface with several discrete control points (actuator locations) to result in a smoother curve compared to traditional single-point rigid actuation.

The morphing waverider concept is one in which a waverider is morphed to maintain shock attachment and improve aerodynamic performance compared to a rigid waverider across a wide range of Mach number. Classically, rigid waveriders incur performance penalties when operated away from their design speeds. The morphing waverider concept, in its ideal formulation, demonstrates large drag improvements relative to a rigid waverider operated across a wide range of Mach number. In practice, however, a perfectly morphing structure is infeasible, leading to investigations into the tradeoff between the complexity of a morphing control system and the resulting impact on the vehicle's aerodynamics. Intelligent selection of a small number of control points for a morphing waverider can significantly improve the aerodynamic performance compared to a baseline rigid vehicle.

Figure 1:
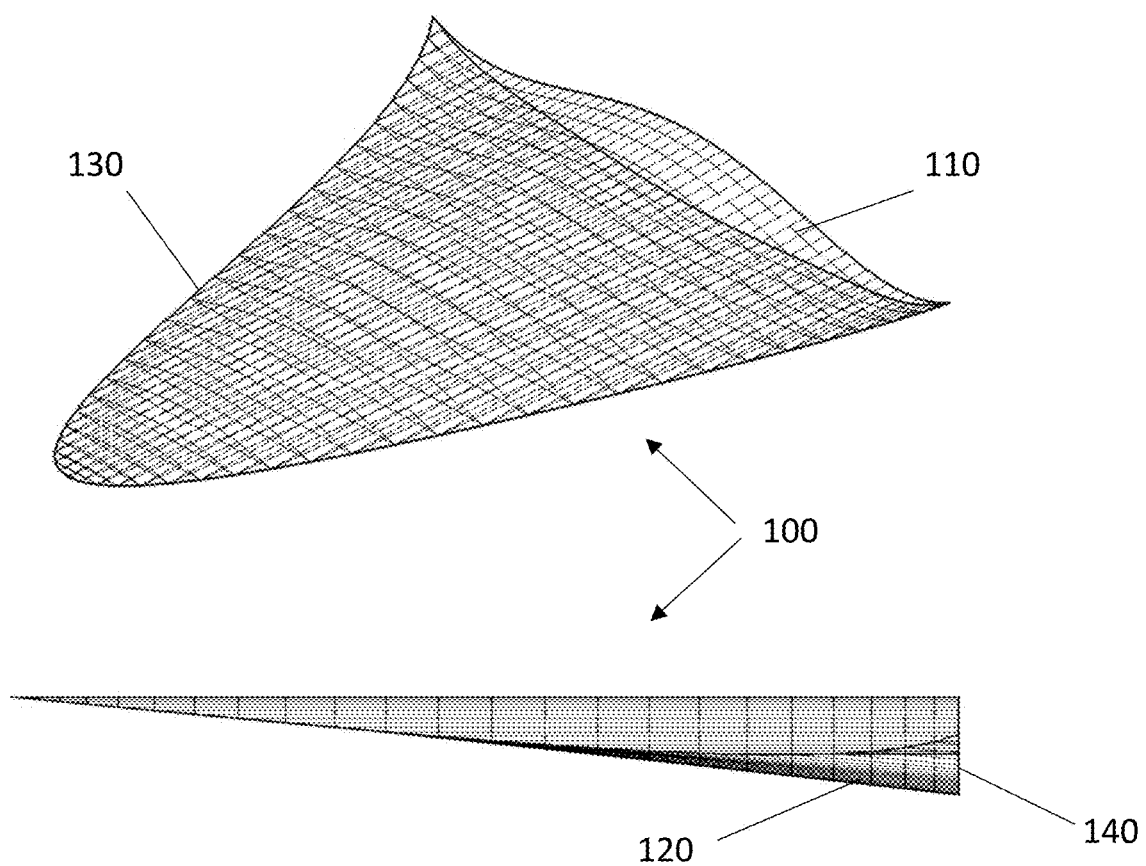
FIG. 1 shows two schematic wire-frame views of a waverider.

Referring first to FIG. 1, a hypersonic waverider 100 includes a relatively (compared to the bottom surface) stiff upper surface 110 and a more flexible lower surface 120. The upper and lower surfaces generally stretch from the leading edge 130 of the waverider to the base 140 of the waverider. This flexible lower surface 120 may be made of conventional aerospace materials and may be actuated at discrete points. It has been discovered that the curvatures of the waverider lower surface can be achieved with a small number of actuation points.

Exemplary embodiments enable the lower surface 120 to be actuated independently of the upper surface 110, simplifying the optimization problem. As the hypersonic vehicle's 100 flight Mach number changes, a morphing control system may update the curvature of the lower surface 120 to ensure optimal performance across the entire operational range. The curvature will be updated through the application of discrete point control applied to the lower surface of the waverider. This morphing control can be achieved actively through the use of shape memory alloys, piezoelectric elements, or conventional control actuation methods.

Figure 2:
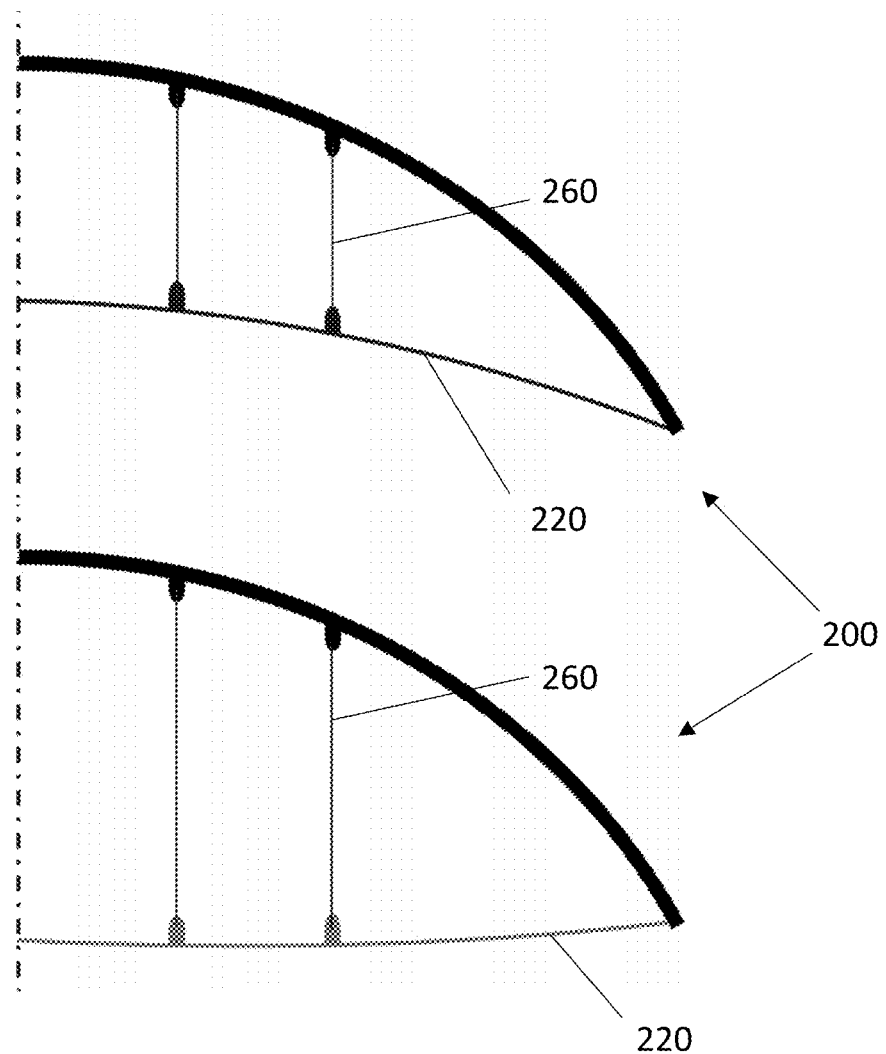
FIG. 2 shows a pair of front cross-sectional schematic views of half of an exemplary waverider, showing example displacement of the lower surface with actuation occurring orthogonal to the lower surface.

Referring now to FIG. 2, morphing control of a waverider 200 may be achieved through an actuator 260 that actuates generally normal to the lower surface 220.

Figure 3:
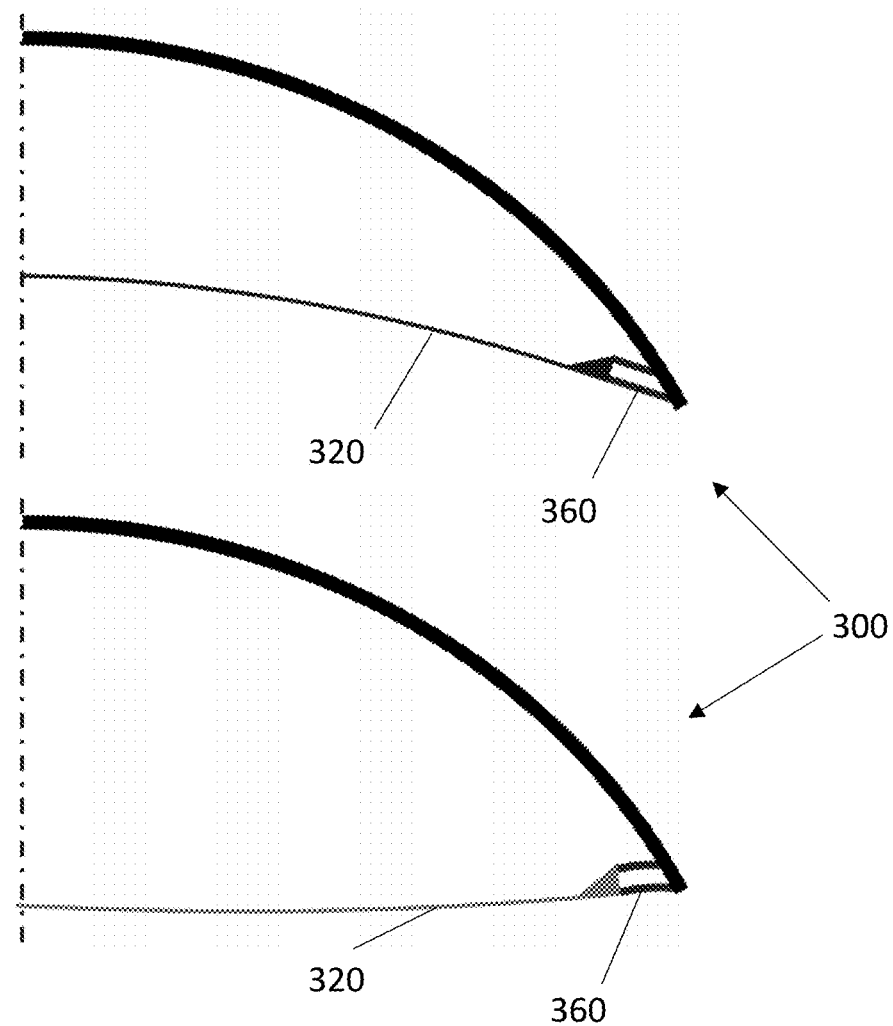
FIG. 3 shows a pair of front cross-sectional schematic views of half of an exemplary waverider, showing example displacement of the lower surface with actuation occurring parallel to the lower surface.

Referring now to FIG. 3, morphing control of a waverider 300 may be achieved through an actuator 360 that actuates generally parallel to the lower surface 320.

This method could also be used for passive actuation by using temperature to drive actuation. This is possible because the steady state flow temperature is a function of Mach number. This enables passive thermal strain systems such as shape memory alloys, coefficient of thermal expansion (CTE) mismatches, and bimetal springs to be used to control the surface curvature.

Surprisingly, it has been demonstrated that the required morphing can be achieved simply by applying control authority to small number of locations across the waverider surface.

Previous methods of morphing only allow one degree of freedom to the design of a morphing surface, which is the uniform surface stiffness. By locally varying the surface stiffness, each stiffness element would result in an additional degree of freedom for an anisotropic morphing surface.

Morphing in 2-D involves translating an initial curve to a higher order curve via enforced displacements in key locations, referred to as control points. Error is inherently present when morphing, as only the control points and locations of a boundary condition will have an error of identically zero. The current method for improving morphing error is to increase the number of control points.

In practice, the morphing error is a function of both the number of control points, the control point positions, and the stiffness of the surface being morphed. 2-point control has been shown to provide a high degree of morphing accuracy for the morphing waverider concept.

A 2-D morphing case can be demonstrated using the elastic curve equation for beam bending (1) along with the integration to find M(x) from the applied load w(x) (2).

$$EIy = \int_a^x dx \int_a^x M(x)dx + C_1 x + C_2 \tag{1}$$

$$M(x) = \iint_n^x -w(x)dx \tag{2}$$

By varying either the elastic modulus (E) or the moment of inertia (I), the stiffness of the beam subjected to a bending load will have a different elastic curve. Moving E and I into the integral allows for them to be varied along the length of a beam (3).

$$y = \int_0^x dx \int_0^x \frac{M(x)}{E(x)I(x)} dx + C_1 x + C_2 \tag{3}$$

The result of (3) is that the beam's effective stiffness can be tailored along the length of the beam to suit the elastic curve requirements. If (3) were to be used in a non-discretized unbounded optimization with ideally-located control points, the elastic curve would identically match the ideal morphed surface and there would be zero morphing error. This is neither a practical nor realistic solution, however, as it would likely result in stiffness changes that would be difficult or impossible to manufacture. Ultimately, finite element analysis may be used in lieu of (3) to determine the solution due to the simplicity of expanding the current efforts to optimization on a 3-D waverider system.

Figure 4:
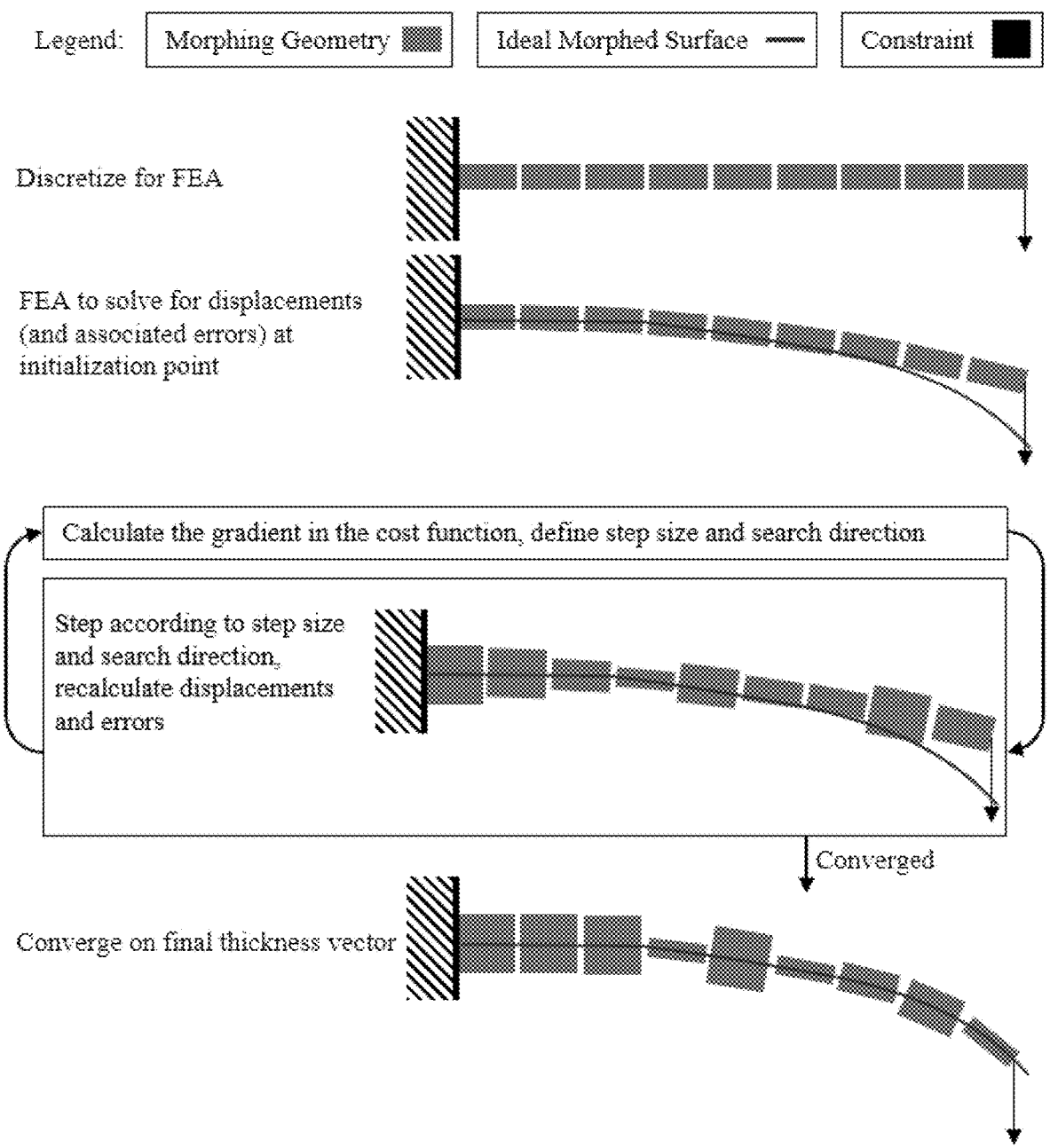
FIG. 4 shows a pictorial schematic view of an exemplary method of designing an exemplary morphable surface.

FIG. 4 shows the concept being expounded and introduces the methodology used to determine the optimal stiffness profile. First, the model is discretized and parameterized to create a function to optimize, then an ideal morphing surface geometry is identified. Each parameter (element thickness) is then optimized to minimize a combination of morphing error and surface mass. To simplify the optimization scheme, the stiffness changes for each element will be modeled by varying the thickness of the element. This variable thickness anisotropic morphing surface will improve the morphing accuracy enabling simplification of the control system and improved aerodynamic performance at the cost of manufacturing complexity. This optimization is done to provide a system that delivers a balance between control system complexity, manufacturing complexity, system mass, and morphing error. This effort will help to understand and design exemplary morphing aerospace structures.

It should be noted that while this particular discussion uses thickness variation to modify local stiffness, a wide variety of methods can be used to vary the anisotropic behavior of a morphing surface. In practice, the change in stiffness could also be done by any one or more of adding ribs, modifying the thickness of a honeycomb structure, locally changing the modulus of the surface material, bimetallic or composite laminates, or any number of other methods. Further, this 2-D discussion can be extended to a 3-D system to design a realistic aerostructure and quantify the aerodynamic effects of the resulting error, as those having skill in the art will understand and appreciate upon reading and understanding the methods detailed herein.

A parameterized Finite Element Model (FEM) of an exemplary morphing waverider backside lower surface profile at Mach 5 is generated, for example by using MSC NASTRAN. The FEM in the present illustration may be made up of 25 nodes connected by 24 PBEAM elements, each with an independent beam parameter card. The selection of 25 nodes was made to ensure sufficient spatial resolution to capture the curvature while minimizing analytical complexity. Single Point Constraints (SPCs) are applied to the end nodes to deliver a pinned-pinned boundary condition. Control points are then determined based on conventional methods used to select the optimal parameter set, resulting in slightly asymmetric control points. The control points in the Mach 5 model are then moved via Enforced Motion Values (SPCDs) to the corresponding location on a Mach 3.5 model to simulate ideal actuation. The resulting morphing error (defined as the node location difference between the ideal Mach 3.5 surface and the morphed Mach 5 model) is then evaluated for a variety of surface thicknesses.

The FEM is then parameterized to enable the trust region optimization to independently control the thickness of all 24 beam elements. This parameterized model is used to provide the cost function and all 24 gradients for each of the 24 element thicknesses. Element thicknesses are constrained within the optimization to ensure reasonable geometric configurations are developed, with each element being between 0.5 mm and 1 cm for a model width of 5.08 cm.

The trust-region algorithm generates a quadratic model of the cost function in the bounded optimization problem. The quadratic model is evaluated with each iteration and the trust region is evaluated. If the quadratic model does not correctly predict the trust region the trust region is reduced. If the quadratic model correctly predicts the cost function, the quadratic model is verified and is used to select the next step direction and the trust region is increased. This is repeated until the overall optimization criterion is met. Given the 24 optimization parameters, the hessian is too computationally expensive to calculate for this problem. Thus, one can make use of a secant method (e.g., the BFGS algorithm) to replace the second derivative with a suitable approximation.

Three optimizations have been performed to demonstrate the wide range of design points for the concept of a morphing surface with varied stiffness. The various weightings of the surface mass and resulting morphing error demonstrate a methodology where the optimal system performance given an allocated mass can be found. To evaluate the overall error, the resulting RMS error ($E_{rms}$) was calculated as seen in Equation 4. $E_{nom}$ in Equation 5 is the average RMS error from the first optimization case, and is used to normalize the error in the cost function.

$$E_{rmz} = \sqrt{\frac{1}{N}\sum_{i=1}^{N} \delta_i^2}, N = 25 \tag{4}$$

$$\overline{E}_{rms} = \frac{E_{rms}}{E_{nom}} \tag{5}$$

Where $\delta_i$ is the nodal error in the FEM and N is the number of nodes. To represent the total mass of the system, the relative mass ($M_r$) of the morphing surface was developed in Equations 6 and normalized in Equation 7. Relative mass is used instead of volume and density, since it yields a straightforward comparison between each case (since the mathematical maximum value is 1) while accurately representing total volumetric density.

$$M_r = \sum_{k=1}^{n} t_k, n = 24 \tag{6}$$

$$\overline{M}_r = \frac{M_r}{t_{max} \times n}, n = 24 \tag{7}$$

Where $t_k$ is the element thickness in the FEM, n is the number of elements, and $t_{max}$ is the maximum allowable element thickness (0.01 m). As a result of this, $\overline{M}_r$ is inherently bounded to be within 0.05 and 1.00. To have the ability to evaluate the relative effects of each parameter (RMS error, relative mass) on the cost function, a scaling factor is applied to the RMS error and the relative mass in Equations 8 through Equation 10. These scaling factors enable finding the optimal minimum error case using $F_1$, a minimized mass and error case in $F_2$, and a very low mass case with reduced error in $F_3$.

The cost function, F, is a function of the normalized RMS error (5) and relative mass (7).

$$F_1 = 1 \cdot \overline{E}_{rms} + 0 \cdot \overline{M}_r \tag{8}$$

$$F_2 = 1 \cdot \overline{E}_{rms} + 1 \cdot \overline{M}_r \tag{9}$$

$$F_3 = 1 \cdot \overline{E}_{rms} + 5 \cdot \overline{M}_r \tag{10}$$

Due to the nature of the bounded optimization and the number of parameters to be varied, the optimization algorithm was likely to find local minima. To ensure a global minima was found the first and second optimization cases were run 25 times, each initialized with randomly set of element thicknesses between the minimum and maximum bounds. To study the design space, two additional runs were initialized at the minimum and maximum thickness bounds, respectively. This provides insight into the overall design space. To conserve computation time, the third high mass weighted optimization case was initialized with the five lowest error results from the error and mass-weighted second case, as well as the minimum and maximum allowable thicknesses.

To provide a reasonable comparison of the error resulting from these three cases, a simple optimization was performed to determine the optimal element thickness assuming all elements were the same thickness. This element thickness was then determined to be 5.53 mm for a 5 cm waverider. This constant thickness case is approximately in the middle of the range between the minimum and maximum bounds on the element thickness for the optimizations and is referred to as the optimal constant thickness case. Additionally, a baseline case from previous work is analyzed to represent a non-optimized case.

The result of the optimizations performed should yield an optimal result for each cost function, as well as the optimal result of a constant thickness. Each optimal result has an associated cost function value as defined in equations (8)-(10), RMS error as defined in (5), relative mass as defined in (7), vector of element thicknesses, and a vector of nodal displacement errors. The combination of each of these outputs allows for straightforward comparison of each case.

To analyze the output of each case, the resulting thicknesses and nodal errors can first be compared. Table 1 shows the resulting RMS error, relative mass, and peak error of each example optimization case as well as the optimal constant thickness. Case 1 shows a 92% decrease in error while only increasing the resulting relative mass by 23% compared to the optimal constant thickness case. Case 2 still demonstrates a 79% decrease in morphing error while also reducing surface mass by 25% compared to the optimal constant thickness case. Case 3 results is a surface mass that is 50% lower than that the optimal constant thickness case, while still reducing error by 1%.

TABLE 1

Optimization Results

|  | RMS Error [m] | Relative Mass [-] | Peak Error [m] |
| --- | --- | --- | --- |
| Case 1 ($F_1 = 1 * \overline{E}_{rms} + 0 * \overline{M}_r$) | 8.31E−6 | 0.682 | 1.85E−5 |
| Case 2 ($F_1 = 1 * \overline{E}_{rms} + 1 * \overline{M}_r$) | 2.27E−5 | 0.417 | 3.83E−5 |
| Case 3 ($F_1 = 1 * \overline{E}_{rms} + 5 * \overline{M}_r$) | 1.09E−4 | 0.278 | 1.68E−4 |
| Optimal Constant Thickness | 1.10E−4 | 0.553 | 2.29E−4 |
| Baseline (non-optimized) | 9.97E−4 | 0.064 | 2.14E−3 |

As shown, even the worst morphing error from the optimization study (case 3) is still an improvement upon the optimal constant thickness case in both RMS error and peak error.

Figure 5:
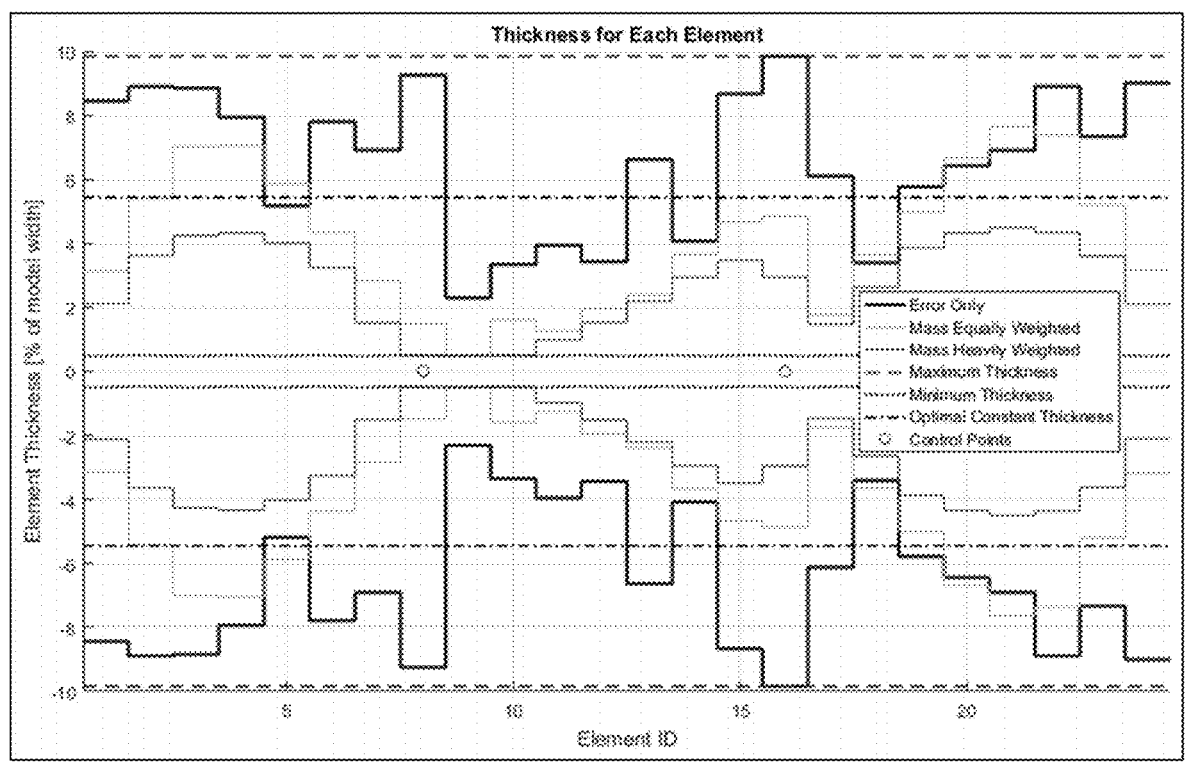
FIG. 5 shows exemplary thickness results from a simplified example method.

FIG. 5 shows what a cross-section of the morphing surface would look like if it were to be manufactured as depicted in the FEM. As can be seen, there are several trends in the optimization to increase the element thickness in the areas around elements 4 and 21, and ramp the thickness up from element 10 to around element 16. Additionally, the cross-section resulting from the optimally designed constant thickness case is approximately average regarding surface mass. Finally, it is noteworthy that the resulting element thicknesses for cases 1 and 2 (in which mass is equally and heavily weighted to error, respectively) are highly correlated, and the optimal result from case 2 is almost identically the result from the case 1 with an overall reduction in thickness of approximately 33%.

Figure 6:
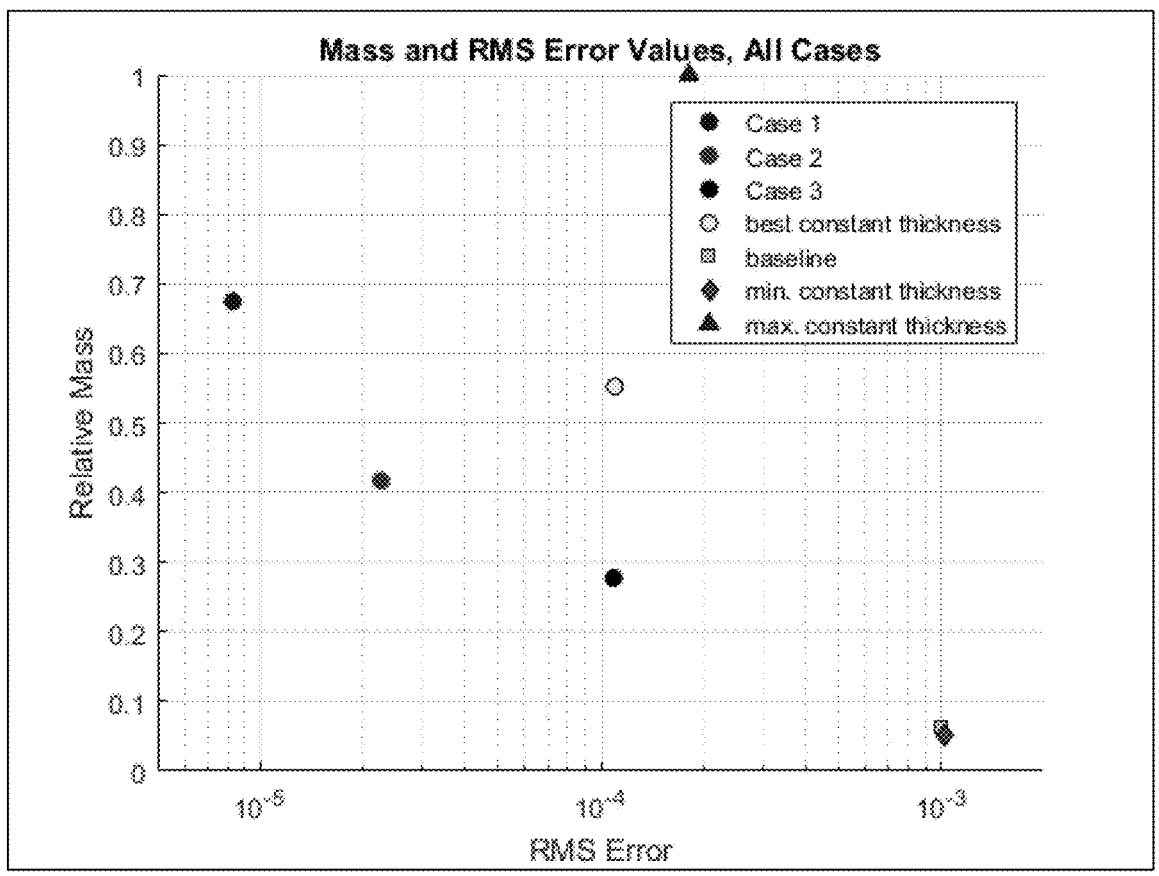
FIG. 6 shows exemplary results of thickness versus error from a simplified example method.

FIG. 6 shows the most important cases out of nearly 90,000 cases that were run. This demonstrates the capability of the optimization study and methodology being developed: all three optimization cases vastly outperform even the best constant thickness morphing surface. Case 1 ($F_1$=1· $\overline{E}_{rms}$+0·$\overline{M}_r$), in which only error is accounted for, has a morphing error 92% lower than the best constant thickness while only increasing the surface mass by 23%. Case 2 ($F_2$=1·$\overline{E}_{rms}$+1·$\overline{M}_r$), in which error and mass are equally weighted, results in a 79% decrease in morphing error while also reducing surface mass by 25%. Case 3 ($F_3$=1·$\overline{E}_{rms}$+5·$\overline{M}_r$) only improves morphing error by 1%, but is able to reduce the surface mass by 50%. Previous CFD analysis has shown that the baseline constant cross section in FIG. 6 using a 2D 2 point control error case and the 6 point control error case extrapolated to a 3D surface achieves 90% and 97% of the aerodynamic benefit relative to an ideal morphing surface, respectively. This effort has demonstrated that using the anisotropic morphing surface provides significantly improved morphing accuracy that will translate to improved aerodynamic performance of the morphing waverider concept.

The present description demonstrates that modifying the stiffness of a morphing surface actuated by a finite number of control points can significantly decrease error in the morphing surface position. Example cases 1, 2, and 3 use various weightings on surface mass in the cost function, and as a result are able to map out the design space and effectively trade error and surface mass. The lowest error case (Case 1) is shown to reduce morphing error by 92% while only increasing surface mass by 23% compared to a morphing surface with an optimal constant thickness. The second lowest error case, in which mass is included in the cost function equally weighted to the error, results in a 79% decrease in morphing error while also reducing surface mass by 25%. The case when mass is weighted far more heavily than error still outperforms the best constant thickness by 1%, while still reducing the surface mass by 50%. This provides insight into the resulting performance benefits as a function of mass costs for this morphing waverider. Finally, prior studies of waveriders has shown the aerodynamic performance is relatively tolerant to surface errors and as a result will allow for the both error and surface mass to be optimized for this application.

The addition of variable thickness morphing surfaces adds degrees of freedom to the optimization, improving the resulting design at the cost of design and manufacturing complexity. To determine the performance benefit of this method, a Trust Region Optimization was performed to converge on optimal element thicknesses in the FEM for several optimization cost functions. To generate a comparative baseline with a constant thickness morphing surface, a simple optimization scheme was used to identify the optimal constant-thickness case mass and error performance. This study demonstrates not only the optimal configuration to enable minimum morphing error but also a methodology to identify the maximum attainable performance for a given mass constraint. Additionally, this effort has validated that the performance benefits associated with the variable thickness morphing surface outweigh the manufacturing and design complexities.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A hypersonic waverider comprising:
   a leading edge;
   a base defining ends of the leading edge;
   an upper surface extending from the leading edge to the base;
   a lower surface extending from the leading edge to the base, wherein the lower surface is controllably morphable and includes a stiffness that varies across the extent of the lower surface; and
   one or more actuators attached to the lower surface and configured to actuate the lower surface from a first disposition to a second disposition,
   wherein the upper and lower surfaces and base enclose an internal volume of the hypersonic waverider;
   wherein the lower surface is configured to have a first disposition relative to the upper surface defining a first waverider shape and a second disposition relative to the upper surface different from the first disposition relative to the upper surface and defining a second waverider shape, thereby providing respective first and second flow characteristics during flight, and
   wherein, compared to a uniform surface stiffness, the stiffness of the lower surface is configured to lower position error of the lower surface when actuated by the one or more actuators.

2. The hypersonic waverider of claim 1, wherein the lower surface stiffness is varied by ribs.

3. The hypersonic waverider of claim 1, wherein the lower surface stiffness is varied by modifying the thickness of a honeycomb structure.

4. The hypersonic waverider of claim 1, wherein the lower surface stiffness is varied by locally changing the modulus of the lower surface material.

5. The hypersonic waverider of claim 1, wherein the lower surface stiffness is varied by bimetallic or composite laminates.

6. The hypersonic waverider of claim 1, wherein the lower surface stiffness is varied by varying the thickness of the lower surface.

* * * * *